United States Patent
Xia

(10) Patent No.: US 7,724,812 B2
(45) Date of Patent: May 25, 2010

(54) METHOD AND APPARATUS FOR DE-JITTERING A CLOCK SIGNAL

(75) Inventor: Jun Xia, Shenzhen (CN)

(73) Assignee: Huawei Technologies Co., Ltd., Shenzhen (CH)

( * ) Notice: Subject to any disclaimer, the term of this patent is extended or adjusted under 35 U.S.C. 154(b) by 865 days.

(21) Appl. No.: 11/498,678

(22) Filed: Aug. 3, 2006

(65) Prior Publication Data

US 2008/0143397 A1 Jun. 19, 2008

Related U.S. Application Data

(63) Continuation of application No. PCT/CN2005/000652, filed on May 10, 2005.

(30) Foreign Application Priority Data

May 10, 2004 (CN) .................. 2004 1 0044467

(51) Int. Cl.
  *H04B 3/46* (2006.01)
(52) U.S. Cl. .................. 375/226; 375/371; 375/372; 375/373; 375/376; 375/377; 375/316
(58) Field of Classification Search .................. 375/226, 375/371–373, 376–377, 316
See application file for complete search history.

(56) References Cited

U.S. PATENT DOCUMENTS

| 4,803,680 | A | * | 2/1989 | Rokugo et al. ............. 370/505 |
| 5,162,746 | A | * | 11/1992 | Ghoshal .................... 327/159 |
| 5,469,478 | A | * | 11/1995 | Lee ........................ 375/376 |
| 5,493,243 | A | * | 2/1996 | Ghoshal .................... 327/158 |
| 5,723,989 | A | * | 3/1998 | Steinlechner ................. 327/3 |
| 5,731,743 | A | * | 3/1998 | Sauer ....................... 331/57 |
| 6,333,651 | B1 | * | 12/2001 | Gregorian et al. .......... 327/156 |
| 6,351,165 | B1 | * | 2/2002 | Gregorian et al. .......... 327/156 |
| 6,674,332 | B1 | * | 1/2004 | Wunner et al. ............... 331/18 |
| 6,842,054 | B2 | | 1/2005 | Wang |
| 7,002,384 | B1 | * | 2/2006 | Chong et al. ............... 327/158 |
| 7,079,616 | B2 | * | 7/2006 | Castiglione et al. ......... 375/376 |
| 2005/0078783 | A1 | * | 4/2005 | Okita ....................... 375/376 |

FOREIGN PATENT DOCUMENTS

JP 5-227017 A 9/1993
WO WO 02/093747 A2 11/2002

\* cited by examiner

*Primary Examiner*—Mohammad H Ghayour
*Assistant Examiner*—Sophia Vlahos
(74) *Attorney, Agent, or Firm*—Leydig, Voit & Mayer, Ltd.

(57) ABSTRACT

The present invention discloses a de-jittering method for a clock signal, which is implemented by adopting a controllable frequency divider and includes: taking the clock signal to be de-jittered as a reference signal, and comparing a feedback clock signal outputted by the controllable frequency divider with the reference signal; generating the control signal that is then transmitted to the controllable frequency divider; the controllable frequency divider performs frequency division upon the input high-frequency signal to generate a stable clock, and the stable clock is outputted as the feedback clock signal which has been de-jittered. The present invention also discloses a de-jittering apparatus for implementing the above-mentioned method, which includes: a circuit for generating a control signal and a controllable frequency divider. By applying the present invention, the de-jittering circuit for clock signal can be simple. What's more, transition between T1 clock frequency and E1 clock frequency can also be implemented to meet practical requirements better.

17 Claims, 5 Drawing Sheets

METHOD AND APPARATUS FOR DE-JITTERING A CLOCK SIGNAL

This application is a continuation of International Patent Application No. PCT/CN2005/000652, filed on May 10, 2005, which claims priority to Chinese Patent Application No. 200410044467.2, filed on May 10, 2004, all of which are hereby incorporated by reference.

FIELD OF THE TECHNOLOGY

The present invention relates to signal transmission technique in electric technology field, more particularly to a de-jittering method and apparatus for a clock signal.

BACKGROUND OF THE INVENTION

In order to make a communication system operate normally, the system's clock and data must meet certain jitter requirements. Therefore, some communication equipments must be equipped with a jitter-attenuating function to wipe off the signal jitter generated during the communication, so as to guarantee accuracy and reliability of the signal reception. Accordingly, a series of international standards and protocols have been presented to regulate de-jittering standards. At present, jitter attenuation of E1 (2048 Kbits/s PCM communication system) and T1 (1544 bits/s PCM communication system) line interface transceivers should follow related protocols such as:

Jitter attenuation protocols for E1 signals include: ITU-T I.431, G.736 . . . 739, G.823 and ETSI TBR12/13;

Jitter attenuation protocols for T1 signals include: PUB62411, PUB43802, TR-SSY 009, TR-TSY 253, TR-TSY 499 and ITU-T I.431, G.703 and G.824.

In order to guarantee the system's de-jittering performance, corresponding templates concerning the system's de-jittering performance requirements have already been set up at present so as to check whether the de-jittering performance of the system based on the template meets relevant requirements. For instance, when measuring the Jitter Transfer Function (JTF), the testing instrument adds jitters to certain frequency points in the transmitted data, and then measures the jitters at corresponding frequency points in the received data; by taking the ratio of a received jitter and an added jitter (generally jitter attenuation with dB unitage) as a vertical coordinate, and taking the frequencies at which the jitters are measured as a horizontal coordinate, a jitter transfer function curve can be formed by connecting these coordinate points. FIGS. 1 and 2 are jitter transfer curve templates of E1 signals regulated in G.736 and that of T1 signals regulated in PUB62411 respectively. The curves of both templates are similar to a frequency response curve of a first-order low-pass filter. The curve obtained by measurement of G.736 template should be below the template curve; while the curve obtained by measurement of PUB62411 template should be between the two template curves. In order to reach this objective, the apparatus must be equipped with jitter-attenuating function. When receiving or transmitting a signal, the data signal's can be de-jittered through the following steps of: extracting a clock from the data with jitter, generating the clock with low jitter by processing the extracted clock via a de-jittering circuit, and then transmitting the signal by this low-jitter clock.

At present, conventional de-jittering method is to use an analogue phase-locked loop de-jittering circuit. The analogue phase-locked loop de-jittering circuit is shown in FIG. 3, which includes: First Input First Output (FIFO) 301, frequency divider by 16 (DIV16) 302, frequency divider by 64 (DIV64) 303, Phase detector (PD) 304, Digital Control Synthesizer (DCS) 305 and Analogue Phase-locked Loop (APLL) 306.

Taking E1 signal transmission system for example, the high-quality 2 MHz (which is practically 2.048 MHz and abbreviated as 2M for convenience) clock outputted by a crystal oscillator is inputted to APLL 306 as the reference clock of APLL 306. APLL 306 outputs a 32 MHz clock that is generated by Voltage Controlled Oscillator (VCO) inside APLL and is of very low jitter. Then, this 32 MHz clock is inputted to the frequency divider by 16 (DIV16) 302 and the desired 2 MHz clock without jitter can be obtained after the frequency division by 16, and the obtained 2 MHz clock is inputted to First Input First Output (FIFO) 301.

It can be seen from the jitter transfer curve templates in FIGS. 1 and 2 that, the corner frequency of jitter attenuation is as low as a few Hz, which requires a number of counting times. Therefore, the 2 MHz clock without jitter, which is outputted to First Input First Output (FIFO) 301, is also inputted to the frequency divider by 64 (DIV64) 303 for frequency division by 64, and the divided signal is then outputted to Phase detector (PD) 304 for phase discrimination, so that there are a number of counting times. Phase detector (PD) 304 outputs a digital control signal to control the counting and accumulating of Digital Control Synthesizer (DCS) 305, synthesizes the 32M clock outputted by Analogue Phase-locked Loop (APLL) 306 into a signal having the same frequency as that of the crystal oscillator clock, and then feeds this signal back to Analogue Phase-locked Loop (APLL) 306. It can also be seen from FIG. 3 that the data signal can be de-jittered by writing the data into FIFO based on the clock CK_EXT extracted from data and reading the data from FIFO based on the post-de-jitter clock.

In this method, because the outputted de-jittered clock is generated by an analogue circuit, the clock should be of high quality theoretically. However, a large feedback loop circuit, which contains an analogue phase-locked loop, digital circuits (including DCS and PD) and so on, is of a complicated structure. And the complicated structure, especially the complexity of the feedback loop circuit with both digital and analogue circuit, will make it difficult to calculate the quantified parameters of the circuit's de-jittering performance, thus difficult to obtain accurate design. What's more, compared with a single analogue circuit or digital circuit, a circuit structure mixed by digital and analogue circuits makes analog simulation difficult, which increases the difficulty of circuit design. The complicated structure brings another obvious disadvantage of which circuit chip dimension is large with low efficiency. In addition, the above-mentioned de-jittering circuit cannot change frequency of the outputted de-jittered clock while de-jittering, so that it is impossible to read the T1 data with the clock frequency of E1 after the T1 data is written into FIFO. In other words, it is very difficult to transfer between T1 clock and E1 clock by using the above-mentioned de-jittering method.

Besides, a de-jittering method for a clock signal is also put forward in U.S. Pat. No. 5,162,746 in the United States, which is titled Digitally Controlled Crystal-Based Jitter Attenuator. The key idea of this scheme is to adopt a digital phase-locked loop and digitally controlled crystal to generate the output clock. Circuit schematic of this method is shown in FIG. 4. This circuit includes: a first divider 401, a second divider 402, divider by 4 403, digital phase detector 404 and digitally controlled crystal oscillator 405.

Therein, digital phase detector 404 receives the clock with jitter that is divided by the first divider 401 and the feedback clock that is divided by the second divider 402, and compares both of them, then outputs a multi-bit digital control signal to digitally controlled crystal oscillator 405. Then, digitally controlled crystal oscillator 405 outputs a clock signal according to this control signal, and a de-jittered clock is outputted after being processed by divider by 4 403. The de-jittered clock is also outputted to the second divider 402 as a feedback clock.

The above-mentioned multi-bit digital control signal can reflect phase difference between the two clocks, and the digitally controlled crystal oscillator 405 can be accurately controlled according to this multi-bit digital control signal. Inside the digitally controlled crystal oscillator 405 there are multilevel operational amplifiers with a capacity load, and changing the load capacity through the digital control signal can change the crystal frequency.

In addition, by changing division value of the first divider 401 and that of the second divider 402 in FIG. 4, bandwidth of the whole digital phase-locked loop can be adjusted so as to meet different applications.

SUMMARY OF THE INVENTION

It can be seen from FIG. 4 that feedback circuit of this jitter attenuator is pretty simple, so the system structure thereof is simpler than that of the first jitter attenuator shown in FIG. 3, but still difficult to implement, especially design of the digitally controlled crystal oscillator. Hereby, the output of crystal oscillator can be taken as a source of de-jittered clock, so that the de-jittered clock is of very high quality. However, the disadvantages are more complexity and less flexibility. The digitally controlled crystal oscillator is complicated to design and the output frequency range is restricted because of the limited pull-in range of the crystal. Multilevel analogue operational amplifiers and large dimension of the load capacity further increase the cost of this scheme. Besides, this de-jittering method cannot implement the transition between T1 clock frequency and E1 clock frequency either, thus cannot meet the practical requirements under certain circumstances.

Therefore, the present invention is to provide a de-jittering method for a clock signal, which can make structure of the de-jittering circuit for E1 or T1 signals simpler and further implement transition between T1 clock frequency and E1 clock frequency, so as to meet practical requirements better.

The present invention also is to provide a de-jittering apparatus for a clock signal, which is of simpler structure and can further implement transition between T1 clock frequency and E1 clock frequency, so as to meet practical requirements better.

The present invention provides a de-jittering method for a clock signal, which adopts controllable divider, includes:

A. taking the clock signal to be de-jittered as a reference signal and comparing it with the feedback clock signal outputted by the controllable divider;

B. generating a control signal according to the comparison result and outputting the control signal to the controllable divider;

C. controllable divider dividing an input high-frequency signal to generate a stable clock signal according to the control signal, and outputting the stable clock signal as feedback clock signal and de-jittered clock signal.

Wherein, in the step B, the generated control signal is outputted to one or two or more controllable dividers; multiplex selection is performed upon the feedback clock signal outputted by the two or more controllable dividers, wherein the selected clock signal is of the same frequency as that of the clock signal to be de-jittered and is taken as a practical feedback signal; in step A, the clock signal to be de-jittered and the practical feedback signal are compared.

Preferably, the step A includes:

A1. dividing the clock signal to be de-jittered and the fed back clock signal, respectively;

A2. comparing the two divided signals in step A1 to obtain phase difference of the two signals;

Preferably, the step B includes:

generating the control signal according to the phase difference information and outputting the control signal to controllable divider.

Preferably, the dividing method in step A1 can be:

dividing the signals with a division coefficient 32 $2^n$ according to a required de-jittering performance;

wherein frequency of the input high-frequency signal is 32 $2^n$ times higher than that of the clock signal to be de-jittered; therein $n \geqq 0$ and n being an integer.

Preferably, the high-frequency signal between two rising edges of the feedback divided clock signal is counted, and the count value is defined as the phase difference information.

Preferably, the process of counting the high-frequency signal includes: starting the count when detecting the rising edge of the feedback divided clock signal, increasing the count value by one when detecting one period of the high-frequency signal each time; when detecting the falling edge of the feedback divided clock signal, decreasing count value by one when detecting one period of the high-frequency signal each time; terminating the counting procedure when detecting the rising edge of the next feedback divided clock signal.

Wherein the frequency of the high-frequency signal used for counting is $2^n$ times higher than that of the clock signal to be de-jittered, wherein the high-frequency signal is outputted by the controllable divider or is introduced from outside.

Wherein step B comprises: positive/negative overflow process is performed upon the phase difference information to obtain the overflow signal and overflow direction information based on the phase difference; step C comprises: the controllable divider divides the input high-frequency signal according to the overflow signal and overflow direction information, and generates the stable clock signal that is outputted as the feedback clock signal and the de-jittered clock signal.

Preferably, the method for obtaining the overflow signal and overflow direction information based on phase difference information may include:

B1. extending the coded sign of the phase difference information;

B2. circularly accumulating the extension result in step B1;

B3. performing positive/negative overflow process upon the accumulation result to obtain the overflow signal and overflow direction information based on the phase difference information.

The method for extending the coded sign of the phase difference information in step B1 may include:

if the absolute value of the phase difference is less than or equal to 64, only the sign bits are extended;

if the absolute value of the phase difference is higher than 64 and less than or equal to 128, the sign bits are extended after formula 1 is calculated in terms of the phase difference, wherein formula 1 is expressed as:

$$|PT|+(|PT|-64)\times 2$$

if the absolute value of the phase difference is greater than 128 and less than or equal to 256, the sign bits are extended after formula 2 is calculated in terms of the phase difference, wherein formula 2 is expressed as:

$$|PT|\times 2+(|PT|-128)\times 4$$

if the absolute value of the phase difference is greater than 256, the sign bits are extended after formula 3 is calculated in terms of the phase difference, wherein formula 3 is expressed as:

$$|PT|\times 4+(|PT|-256)\times 8$$

therein, PT denotes the phase difference.

The present invention provides a de-jittering apparatus for the clock signal, which includes a control-signal generating circuit and a controllable divider; wherein the control-signal generating circuit is configured to receive the clock signal to be de-jittered and a feedback clock signal outputted by the controllable divider, compare the clock signal to be de-jittered with the feedback clock signal and generate a control signal according to the comparison result, and output the control signal to the controllable divider;

the controllable divider is configured to receive the control signal and a high-frequency signal from outside, divide the high-frequency signal according to the control signal to generate a stable clock signal, which is outputted to the control-signal generating circuit as the feedback clock signal and is outputted as the de-jittered clock signal.

There are two or more than two controllable dividers and the apparatus further includes: a multiplex selector; the control signal generated by the control-signal generating circuit is sent to two or more controllable dividers; the multiplex selector is configured to receive the clock signal to be de-jittered and the feedback clock signal outputted by the two or more controllable dividers for multiplex selection, select the feedback clock signal that has the same frequency as the clock signal to be de-jittered, and output the selected signal to the control-signal generating circuit as practical feedback signal.

The control-signal generating circuit may include: a reference signal divider, a feedback clock signal divider, a phase detector and a coding accumulator; wherein the reference signal divider is configured to receive the clock signal to be de-jittered and output the signal to the phase detector after dividing it;

the feedback clock signal divider is configured to receive the feedback clock signal outputted by the controllable divider and output the signal to the phase detector after dividing it;

the phase detector is configured to discriminate the phases of the two input signals to generate the phase difference information, which is outputted to the coding accumulator;

the coding accumulator is configured to perform coding and accumulation upon the phase difference to generate the control signal with overflow signal and overflow direction information, which is outputted to the controllable divider.

The coding accumulator can include: a coded sign extension module, a circular accumulator and a positive/negative overflow processing module; wherein the coded sign extension module is configured to receive the phase difference information to extend coded sign bit of the phase difference, and transmit the processed result to the circular accumulator;

the circular accumulator is configured to perform circular accumulation upon the above processed result and transmit the accumulation result to positive/negative overflow processing module;

positive/negative overflow processing module is configured to perform the positive/negative overflow process upon the accumulation result to obtain the overflow signal and overflow direction information based on the phase difference information, the buffer outputs the overflow signal and overflow direction information to the controllable divider.

Preferably, the controllable divider is a digital frequency synthesizer or other devices that can perform frequency division according to the control signal. It can be seen from the above technique scheme that, in the de-jittering method for the clock signal, the digital phase-locked loop is constituted by adopting the controllable divider and basic principle of digital phase-locked loop is used, the control signal of the controllable divider is generated by comparing the clock signal to be de-jittered as the reference signal and the feedback clock signal outputted by the controllable divider, so that the stable clock signal outputted by the controllable divider can be adjusted and controlled, the stable clock signal is outputted as the feedback clock signal and the clock signal to be de-jittered. Therefore, principle of this method is simple and it is easy to implement.

The de-jittering apparatus for the clock signal includes a control-signal generating circuit and a controllable divider, which is of distinct structure and easy implementation. The apparatus bears the advantages of low cost and high reliability because of very little area occupied in the integrated circuit.

In addition, because the control-signal generating circuit generates the control signal according to a signal that is to be de-jittered, it can control multiple controllable dividers to output different de-jittered clock signals. If two controllable dividers are adopted, when only one T1 or E1 clock signal to be de-jittered is inputted, two de-jittered clock signals, namely a T1 signal and an E1 signal, can be outputted, so that transition between T1 clock signal frequency and E1 clock signal frequency can be implemented to meet practical requirements better.

DETAILED DESCRIPTION OF THE EMBODIMENT

To make technical scheme and advantages of the present invention more distinct and understandable, the present invention will be described hereinafter with reference to the accompanying drawings and two preferable embodiments.

The de-jittering method and apparatus for the clock signal in the embodiment adopts controllable dividers to constitute a digital phase-locked loop, and uses the basic principle of digital phase-locked loop to attenuate jitter of the clock signal, wherein the de-jittering procedure includes:

A. taking the clock signal to be de-jittered as a reference signal, and comparing it with a feedback clock signal outputted by a controllable divider;

B. generating a control signal according to the comparison result and outputting the control signal to the controllable divider;

C. the controllable divider dividing the input high-frequency signal to generate a stable clock signal according to this control signal, and outputting the stable clock signal as the feedback clock signal and the de-jittered clock signal.

The First Preferable Embodiment

Figure 5:
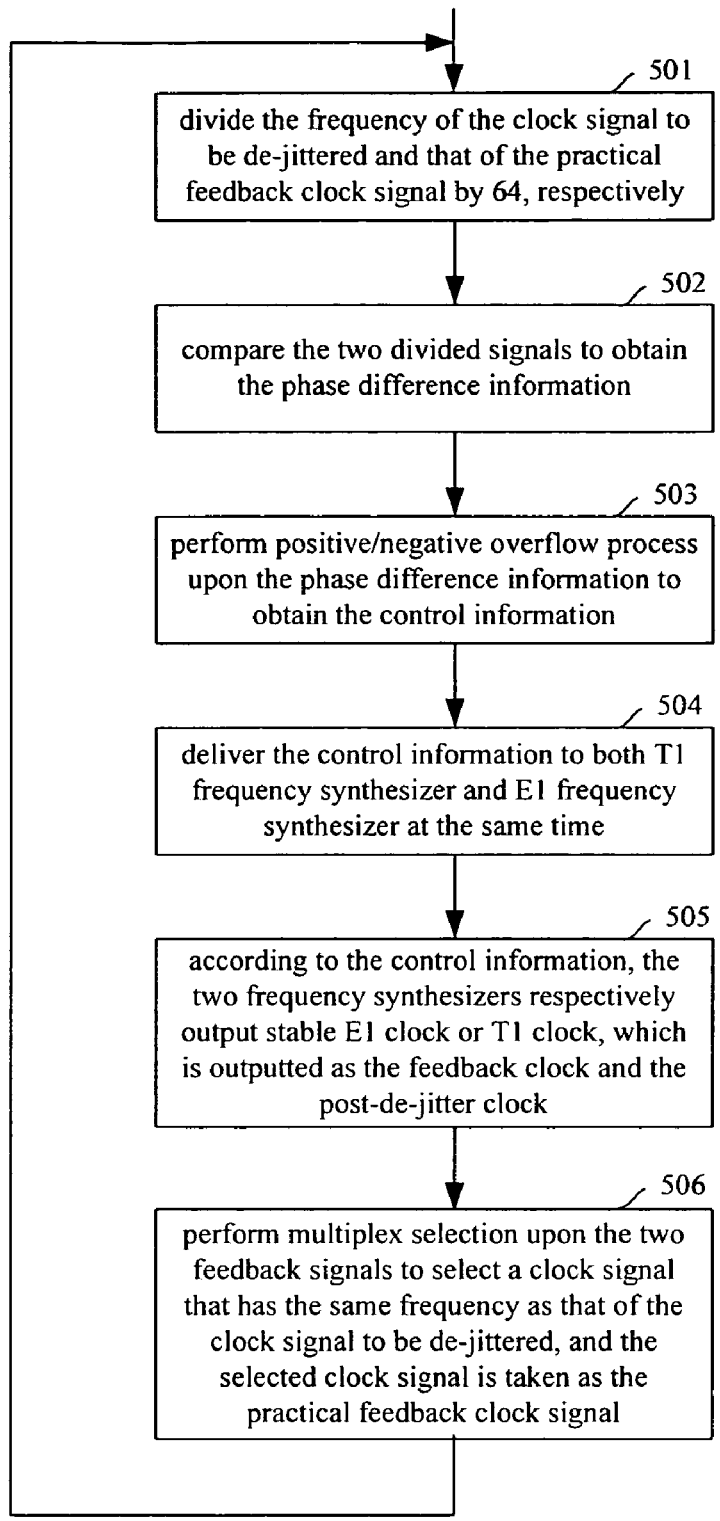
FIG. 5 is a flowchart illustrating the clock signal de-jittering method of the first embodiment in the present invention.

This embodiment mainly attenuates jitter of E1 or T1 clock signals and adopts two controllable dividers to implement transition between E1 clock frequency and T1 clock frequency. The two controllable dividers in the present embodiment are both implemented by adopting a frequency synthesizer, but other devices that can implement controllable frequency division can also be adopted. The specific procedure thereof is shown in FIG. 5, wherein FIG. 5 is a flowchart illustrating the clock signal de-jittering method of the first preferable embodiment in the present invention. This procedure includes the following steps:

Step 501: the E1 or T1 clock signal to be de-jittered as well as the practical feedback clock signal is divided by 64, respectively.

The present embodiment specifically adopts 64-division according to performance requirement upon de-jittered T1 or E1 clock signal, and other clock signals to be de-jittered can adopt the division coefficient 32 $2^n$ for division according to the desirable de-jittering performance.

Step 502: the two divided signals are compared to obtain phase difference information.

Specifically, between two rising edges of the divided feedback clock signal, a high-frequency signal whose frequency is $2^n$ times higher than that of the clock signal to be de-jittered is counted, and the counted value is determined as phase difference information. The high-frequency signal can be either outputted by the frequency synthesizer or be introduced from outside. Therein, $n \geq 0$ and n is an integer. In the present embodiment n=3, which is an empirical value obtained through lots of experiments; for other signals to be de-jittered, the values of n can also be obtained through experiments. If the signal to be de-jittered is a T1 clock signal, frequency of the high-frequency signal is $1.5 \cdot 2^3 = 12$ MHZ; if the signal to be de-jittered is an E1 clock signal, frequency of the high-frequency signal is $2 \cdot 2^3 = 16$ MHZ.

The counting method here is to start counting when detecting the rising edge of the feedback divided clock signal and to increase the count value by one each time detecting one periodic high-frequency signal; decrease the count value by one each time detecting one periodic high-frequency signal when the falling edge of the divided clock signal to be de-jittered; the counting procedure terminates when detecting the rising edge of the next feedback divided clock signal.

Step 503: positive/negative overflow process upon the phase difference information is performed to obtain the control information containing overflow signal and overflow direction.

The specific method is: the coded sign of the phase difference information is extended at first; the extension result is circularly accumulated; positive/negative overflow process upon the accumulation result is performed to obtain the overflow signal and overflow direction information based on the phase difference information.

Therein, the method for extending the coded sign of the phase difference information is shown in table 1.

TABLE 1

| Phase difference (13 bit) | Coded mode (17 bit) |
|---|---|
| $|PT| \leq 64$ | only the sign bits are extended |
| $64 < |PT| \leq 128$ | First calculating the formula $|PT| + (|PT| - 64) \times 2$, then extending the sign bits |
| $128 < |PT| \leq 256$ | First calculating the formula $|PT| \times 2 + (|PT| - 128) \times 4$, then extending the sign bits |
| others | First calculating the formula $|PT| \times 4 + (|PT| - 256) \times 8$, then extending the sign bits |

In other words: if absolute value of the phase difference is less than or equal to 64, only the sign bits are extended. If absolute value of the phase difference is greater than 64 and less than or equal to 128, the sign bits are extended after calculating formula 1 in terms of the phase difference. If absolute value of the phase difference is greater than 128 and less than or equal to 256, the sign bits are extended after calculating formula 2 in terms of the phase difference. If absolute value of the phase difference is greater than 256, the sign bits are extended after calculating formula 3 in terms of the phase difference;

the formula 1 is expressed as $|PT|+(|PT|-64) \times 2$ the formula 2 is expressed as $|PT| \times 2+(|PT|-128) \times 4$ the formula 3 is expressed as $|PT| \times 4+(|PT|-256) \times 8$ Therein, PT denotes the phase, difference. The most straightforward method for extending the sign bits are to fill the required bits with current sign bit value. For instance, current phase difference is negative and sign bit is 1, and then the required bits are filled with 1; current phase difference is positive and sign bit is 0, and then the required bits are filled with 0.

In view of reducing loop bandwidth and making jitter attenuation of phase-locked loop close to linear, signs of the input 13-bit phase difference PT needs to be extended in the coded sign extension module, like being extended to 17 bits; this is because the turning frequency curve can be closer to a straight line and be located below the template curve through extending the coded sign bits, and the accumulation counting time is increased after the bit extension, namely that more time is needed to count pulses, so that variance rate of the output frequency is lower and loop bandwidth is reduced accordingly.

Therefore, it is necessary to extend and encode the signs of the inputted 13-bit phase difference PT to 17-bit, the encoded 17-bit value is circularly accumulated and whether the accumulated result is positive or negative is real-timely judged. Assuming that the accumulated result is positive when the initial bit is 0 and negative when the initial bit is 1, overflow arises when the sign bit is changed during accumulation, namely that positive overflow arises when the initial bit of accumulated result changes from 0 to 1 and negative overflow arises when the initial bit of accumulated result changes from 1 to 0. ADJ denotes overflow signal and DIR denotes overflow direction. For instance, if the recorded phase difference magnitude is 6 and direction is negative, after the phase difference is processed by a circular accumulator and a positive/negative overflow processing module, 6 ADJ overflow signals will be generated and all the 6 signals are negative overflow from 1 to 0.

Step 504: the control information including overflow signal and overflow direction information is transmitted to T1 frequency synthesizer and E1 frequency synthesizer.

Step 505: T1 frequency synthesizer and E1 frequency synthesizer divide the inputted high-frequency signal according this control information, respectively, and increase or decrease pulse period of the inputted high-frequency signal according to the control information.

E1 frequency synthesizer divides the input high-frequency signal, generates a stable 2 MHz clock signal, which is then outputted as the feedback clock signal and de-jittered clock signal. T1 frequency synthesizer divides the inputted high-frequency signal, generates a stable 1.5 MHz clock signal, which is then outputted as the feedback clock signal and de-jittered clock signal.

Frequency of the input high-frequency signal is 32 $2^n$ times higher than that of the signal to be de-jittered; therein n≧0 and n is an integer. As far as the current embodiment is concerned, the high-frequency signal inputted to T1 frequency synthesizer is 1.5 MHZ 32 $2^1$=96 MHZ, and that inputted to E1 frequency synthesizer is 2 MHZ 32 $2^1$=128 MHZ.

Step 506: multiplex section is performed upon the two feedback signals to select a signal which has the same frequency as that of the clock signal to be de-jittered is selected from the two feedback clock signals, and the selected signal is taken as the practical feedback clock signal; then it returns to step 501.

In the present embodiment, in order to implement transition between T1 clock frequency and E1 clock frequency, two frequency synthesizers are adopted and multiplex selection is performed. In practical application, if the transition between T1 clock frequency and E1 clock frequency is not needed, one frequency synthesizer is enough and there is no need to perform multiplex selection to attenuate jitter of the signal.

The Second Preferable Embodiment

The apparatus of this embodiment mainly attenuates jitter of E1 or T1 clock signal and adopts two controllable dividers to implement transition between E1 clock frequency and T1 clock frequency. The two controllable dividers in the present embodiment are both implemented by adopting frequency synthesizer, but other devices that can implement controllable frequency division can also be adopted.

Figure 6:
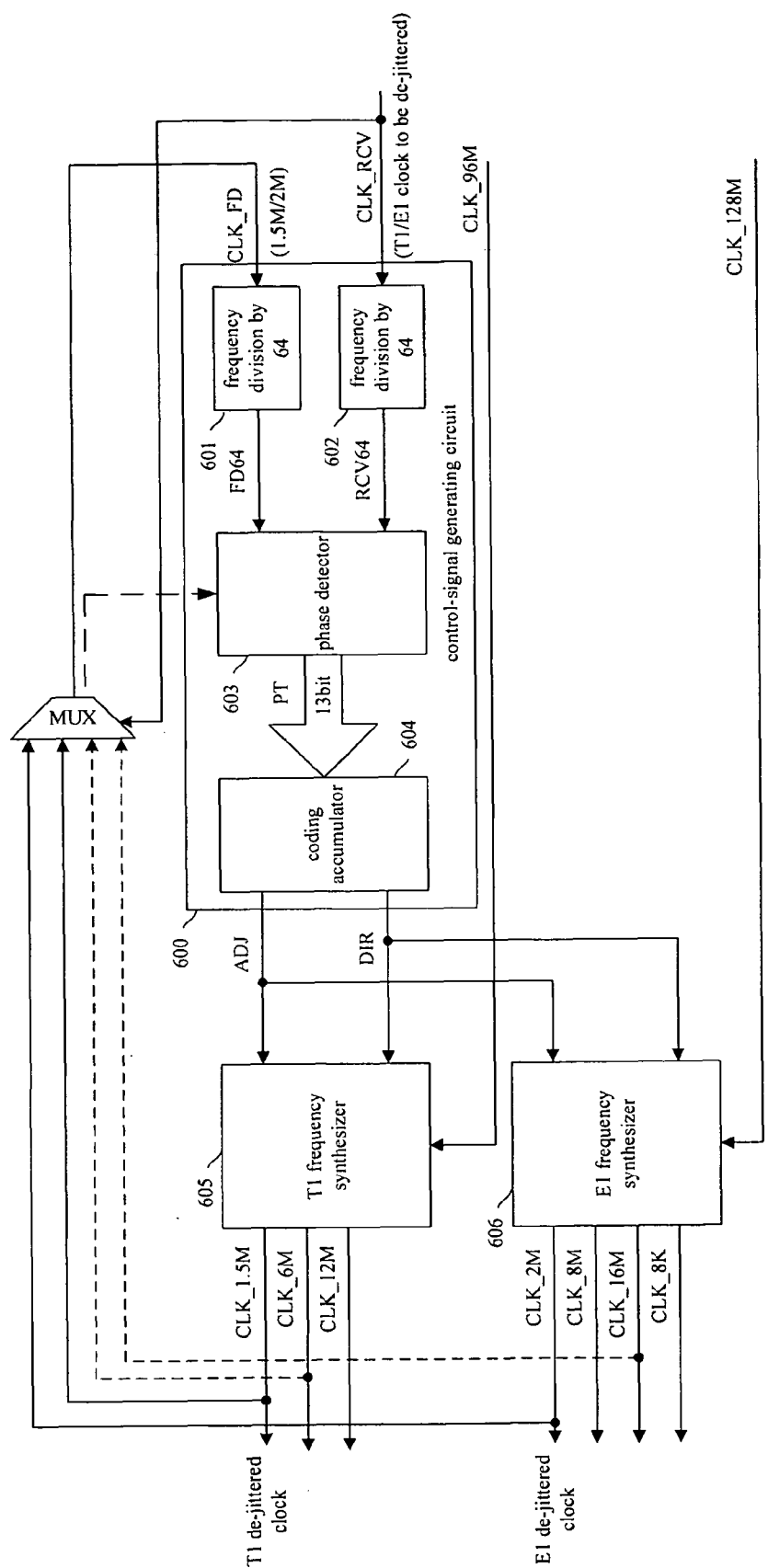
FIG. 6 is a schematic diagram illustrating the structure and operating principle of the clock signal de-jittering apparatus of the second embodiment in the present invention.

As shown in FIG. 6, FIG. 6 is a schematic diagram illustrating the structure and operating principle of the clock signal de-jittering apparatus of the second preferable embodiment in the present invention. This de-jittering apparatus for the clock signal includes: control-signal generating circuit 600, multiplex selector (MUX) 607, T1 frequency synthesizer 605 and E1 frequency synthesizer 606.

Therein, control-signal generating circuit 600 receives the clock signal to be de-jittered, the feedback clock signal outputted by multiplex selector (MUX) 607 and the high-frequency signal whose frequency is $2^n$ times higher than the clock signal to be de-jittered. The clock signal to be de-jittered is taken as the reference signal and compared with the feedback clock signal, and then the control signal is generated according to the comparing result and is outputted to both T1 frequency synthesizer 605 and E1 frequency synthesizer 606.

Multiplex selector (MUX) 607 receives the clock signal to be de-jittered, the feedback clock signal outputted by T1 frequency synthesizer 605, the feedback clock signal outputted by E1 frequency synthesizer 606, the 12 MHz high-frequency outputted by T1 frequency synthesizer 605 and the 16 MHz high-frequency outputted by E1 frequency synthesizer 606. Multiplex selector (MUX) 607 selects a feedback clock signal that has the same frequency as that of the inputted E1 or T1 clock signal to be de-jittered, the selected signal is taken as the practical feedback clock signal and outputted to control-signal generating circuit 600; MUX also selects the high-frequency signal corresponding to the frequency of E1 or T1 that is then outputted to control-signal generating circuit 600.

In the present embodiment, if the input clock signal to be de-jittered is the T1 clock signal, multiplex selector (MUX) 607 will select the feedback clock signal outputted by T1 frequency synthesizer 605 and the 12 MHz high-frequency signal; if the inputted clock signal to be de-jittered is the E1 clock signal, multiplex selector (MUX) 607 will select the feedback clock signal outputted by E1 frequency synthesizer 605 and the 16 MHz high-frequency signal. In other words, each high-frequency signal outputted by a controllable divider corresponds to one kind of clock signal to be de-jittered.

In the current embodiment, the 12 MHz high-frequency signal generated by T1 frequency synthesizer 605 and the 16 MHz high-frequency signal generated by E1 frequency synthesizer 606 are used, and multiplex selector (MUX) 607 decides which high-frequency signal to use according to whether the inputted signal to be de-jittered is T1 or E1 clock signal. In practical application, the two high-frequency signals can also be introduced from outside.

In FIG. 6, control-signal generating circuit 600 includes: feedback clock signal frequency divider by 64 601, reference signal frequency divider by 64 602, phase detector 603 and coding accumulator 604.

Feedback clock signal frequency divider by 64 601 receives the practical feedback clock signal outputted by multiplex selector (MUX) 607 and outputs this signal to phase detector 603 after dividing it by 64. Reference signal frequency divider by 64 602 receives the T1 or E1 clock signal to be de-jittered and outputs this signal to phase detector 603 after dividing it by 64.

Phase detector 603 acquires the phase difference information between the two input signals by comparing the rising edge and falling edge of the two signals. Specifically in the embodiment of the present invention, phase detector 603 receives the high-frequency signal outputted by multiplex selector (MUX) 607, which has a frequency $2^n$ times higher than that of the input clock signal to be de-jittered, and discriminates phases of the two input signals to generate phase difference information that is then outputted to coding accumulator 604.

Signal FD64 and RCV64 are generated after the feedback clock signal (CLK_FD) and clock signal to be de-jittered (CLK_RCV) in FIG. 6 are divided by 64, respectively. When the input signal CLD_RCV is E1 sequence clock frequency 2 MHz, FD64 and RCV64 are both 32 KHz signals. Phase difference information is generated by making use of CLK_16M (E1) to detect rising edge of signal FD64 and falling edge of signal RCV64.

When the input signal CLD_RCV is T1 sequence clock frequency 1.5 MHz, FD64 and RCV64 are both 24 KHz signals. Phase difference information is generated by making use of CLK_12M (T1) to detect rising edge of signal FD64 and falling edge of signal RCV64.

Figure 7:
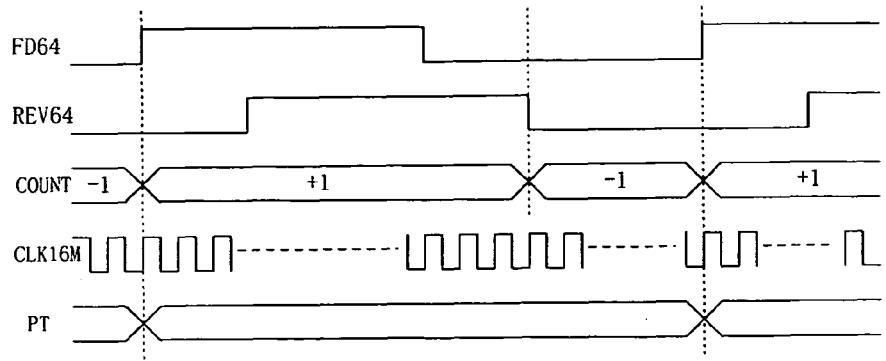
FIG. 7 is the time sequence chart of the phase detector in the embodiment shown in FIG. 6.

With reference to FIG. 7, FIG. 7 is the time sequence chart of the phase detector in the embodiment shown in FIG. 6. This time sequence is obtained when the input CLK_RCV is the E1 clock signal.

Therein, when the rising edge of FD64 signal (namely the feedback signal divided by 64) is detected, COUNT will be started from 0 for CLK16M, which means the counting value increases by one for each period of 16 MHz signal; when the falling edge of REV64 signal (namely the CLK_RCV E1 clock signal divided by 64) is detected, COUNT value will decrease by one for each period of 16 MHz signal. When the rising edge of FD64 signal is detected again, this COUNT value will be outputted to phase difference PT and COUNT will be cleared for new counting. Of course, other processes can also be adopted to determine the phase difference information between FD64 and RCV64.

During the procedure of determining the phase difference information, if 16 MHz clock is used to count the 32 KHz signal, absolute value of the maximum phase difference should be $2^9$; in view of the deviation between the clock and the signal, practical phase difference may exceed $2^9$, so a 10-bit binary number can completely represent all possible phase difference. Besides, a sign bit indicating direction of the phase difference should be added, which indicates whether the feedback signal is early or late to the reference signal. In this way, an 11-bit binary number is enough to represent phase difference information. But in practical application, it is recommended to add more sign bits to represent the phase difference information, like adopting such phase difference information of which the sign bits are extended to 13 bits, so as to guarantee that, when division coefficient of the divider is increased or the maximum phase discrimination value increases because higher frequency clock is adopted for edge detection and phase difference measurement, there is no need to adjust bits of this sign and the problem can be solved just by decreasing the filled bits. The increasing division coefficient of the divider or adopting higher frequency clock for edge detection and phase difference measurement is usually to enhance the de-jittering performance of the system toward E1 or T1 signal.

Coding accumulator 604 is used to process the recorded 13-bit phase difference information, so as to obtain the overflow signal and overflow direction according to phase difference magnitude and phase difference direction in the phase difference information, wherein the overflow signal and overflow direction are used for the two control frequency synthesizers to adjust signal frequency. Specifically in the present embodiment, the phase difference information is encoded and accumulated to generate the control signal including overflow signal and overflow direction, and the control signal is outputted to T1 frequency synthesizer 605 and E1 frequency synthesizer 606.

Figure 8:
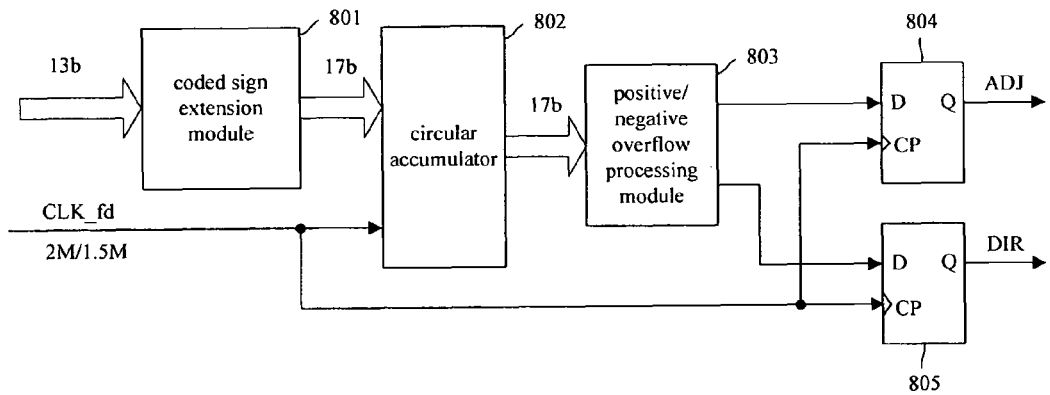
FIG. 8 is a schematic diagram illustrating the coding accumulator in the embodiment shown in FIG. 6.

Internal structure of coding accumulator 604 is shown in FIG. 8, wherein FIG. 8 is a schematic diagram illustrating the coding accumulator in the embodiment shown in FIG. 6. Coding accumulator 604 includes: a coded sign extension module 801, a circular accumulator 802, a positive/negative overflow processing module 803, a first D latch 804 and a second D latch 805.

The coded sign extension module 801 receives 13-bit phase difference information, extends its coded sign bits to generate a 17-bit control signal and sends this control signal to circular accumulator 802.

The circular accumulator 802 performs circular accumulation upon the 17-bit control signal by using 2 MHz or 1.5 MHz clock, and then sends the result to positive/negative overflow processing module 803.

The 2 MHz or 1.5 MHz clock here can also be generated by E1 frequency synthesizer 606 or T1 frequency synthesizer 605, wherein multiplex selector 607 selects one signal according to the input signal to be de-jittered and outputs the selected signal to circular accumulator 802. These two signals can also be introduced from outside.

The positive/negative overflow processing module 803 performs positive/negative overflow process upon the accumulated result to obtain overflow signal and overflow direction information based on the phase difference information, sends the overflow signal to the first D latch 804 for outputting it to E1 frequency synthesizer 606 and/or T1 frequency synthesizer 605, sends the overflow direction to the second D latch 805 for outputting it to E1 frequency synthesizer 606 or T1 frequency synthesizer 605.

In FIG. 6, T1 frequency synthesizer 605 divides the input 96 MHz high-frequency signal according to the control signal information including overflow signal and overflow direction, and increases or decreases high-frequency signal pulse period of the input divided signal according to this control information, so as to generate the stable 1.5 MHz clock signal, which is then outputted to multiplex selector 607 as the feedback clock signal and outputted as the de-jittered clock. T1 frequency synthesizer 605 in the present embodiment also outputs a 12 MHz high-frequency signal to multiplex selector 607.

E1 frequency synthesizer 606 divides the input 128 MHz high-frequency signal according to the control signal information, and increases or decreases high-frequency signal pulse period of the input divided signal according to this control information, so as to generate stable 2 MHz clock signal, which is then outputted to multiplex selector 607 as the feedback clock signal and outputted as the de-jittered clock. E1 frequency synthesizer 606 in the present embodiment also outputs a 16 MHz high frequency signal to multiplex selector 607.

Digital frequency synthesizer is mainly used to increase or decrease high-frequency (say 128 MHz) pulse period according to the overflow signal and overflow direction outputted by the coding accumulator, so as to change the frequency of the output clock. One objective of the digital phase-locked loop is to make frequency of the output clock keep tracking that of the input clock (or called reference clock).

Figure 9:
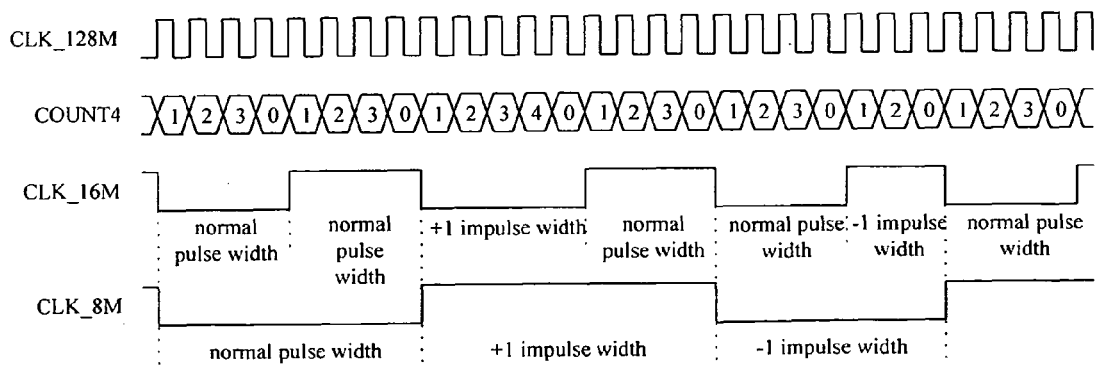
FIG. 9 is the time sequence chart of the digital frequency synthesizer in the embodiment shown in FIG. 6.

Still taking E1 clock for example, with reference to FIG. 9, FIG. 9 is the time sequence chart of the digital frequency synthesizer in the embodiment shown in FIG. 6. Therein, CLK__128M is the input high-frequency signal, COUNT4 is a count value, CLK__16M is a divided clock signal and CLK__8M is another divided clock signal.

In E1 frequency synthesizer 606, low-jitter clock CLK__128M is inputted and the clock to be de-jittered is counted. If the clock signal to be de-jittered is 16 MHz, the corresponding count number is 4 normally, namely that the low-jitter clock CLK__128M is divided by 8 before being inputted and the CLK__16M signal is outputted. When the coding accumulator outputs ADJ as 1, which means the coding accumulator outputs an overflow signal, current count value will be changed to 3 or 5 according to the overflow direction DIR. Specifically, the method for changing count value is: when DIR=0, the count value is 5; when DIR=1, the count value is 3. In other words, at the moment when the coding accumulator overflows, 128 MHz clock period needs to increase or decrease the output CLK__16 MHz by one clock pulse, as shown in FIG. 9, so as to change frequency of the output clock signal and reach the de-jittering objective.

According to the present invention embodiment, by adjusting the frequency and corresponding count value of the low-jitter clock that is inputted to frequency synthesizer, the output clock of corresponding frequency can be obtained.

In practical application, the adjusted frequency of count value COUNT is much lower than that shown in FIG. 9, that's because overflow of the accumulator will not occur very frequently. It can be deduced analogically according to the output 16 MHz clock and 8 MHz clock that, when the output clock is 2 MHz, the maximum jitter should be 2M/128M=0.0156UI, which meets the requirement of relevant international specification.

Figure 1:
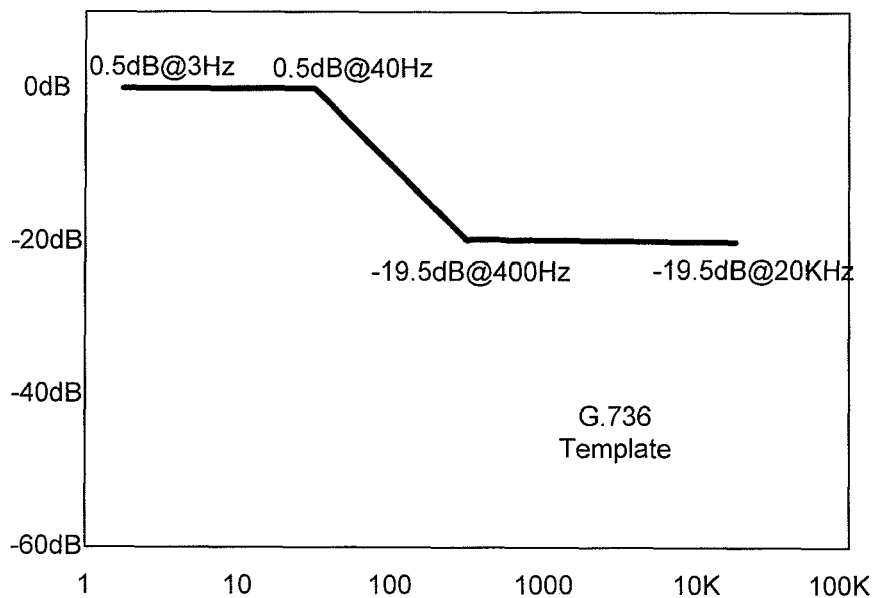
FIG. 1 is a schematic diagram illustrating G.736 JTF template of E1 signal in the prior art.
Figure 2:
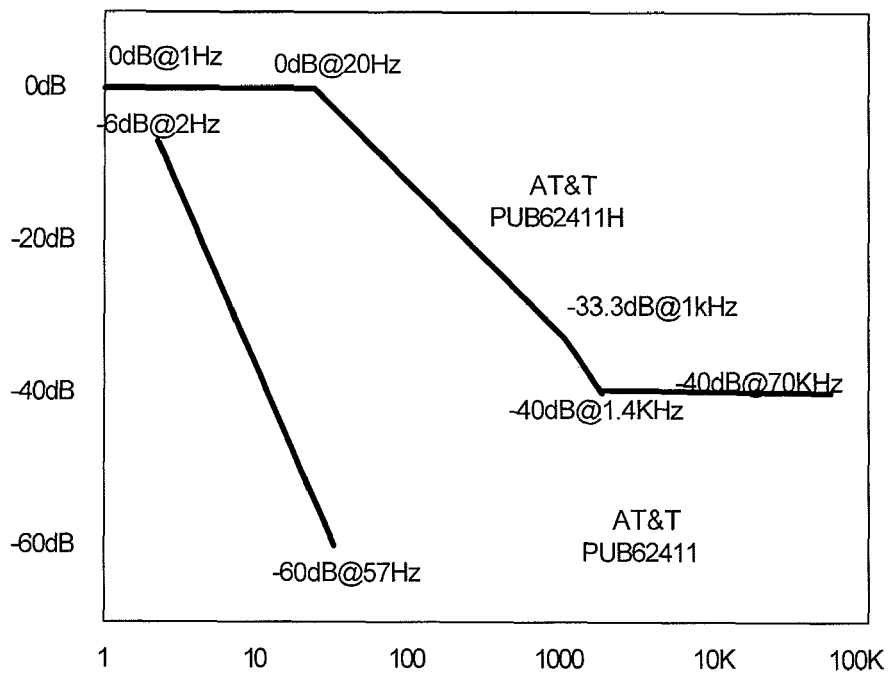
FIG. 2 is a schematic diagram illustrating AT & T PUB62411 JTF template of T1 signal in the prior art.
Figure 3:
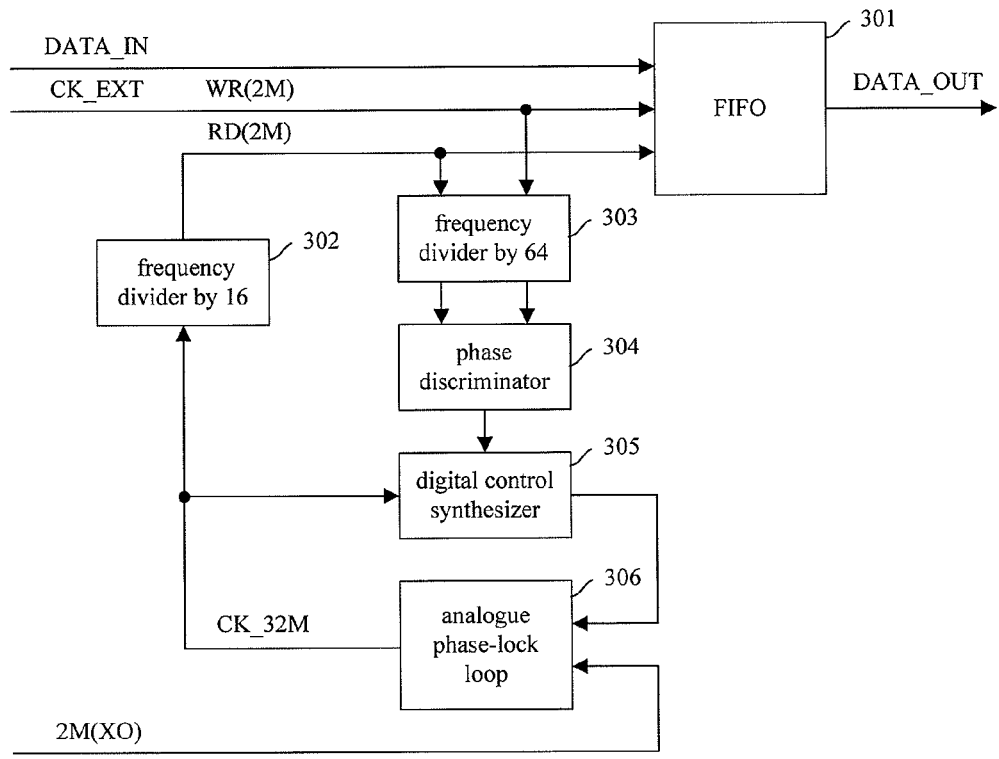
FIG. 3 is a schematic diagram illustrating the de-jittering method using an analogue phase-locked loop in the prior art.
Figure 4:
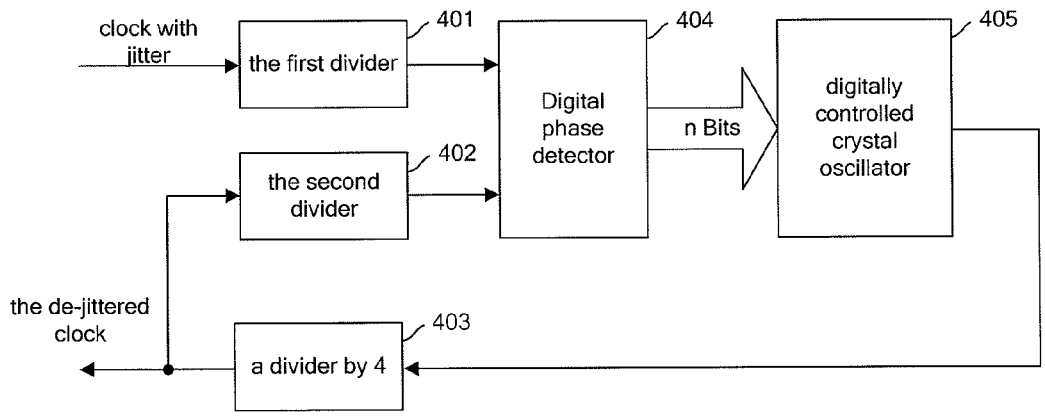
FIG. 4 is a schematic diagram illustrating the de-jittering method using a digitally controlled crystal oscillator in the prior art.

In the present embodiment, regardless of the inputted clock to be de-jittered being E1 clock signal or T1 clock signal, both de-jittered E1 clock signal and T1 clock signal can be outputted. In this way, as to the FIFO in FIG. 3, it is selectable whether to adopt E1 clock signal or T1 clock signal as the read clock to read the data, so that the transition between T1 and E1 clock signal is implemented.

In the present embodiment, in order to implement the transition between T1 and E1 clock frequency, two frequency synthesizers are adopted and multiplex selector is adopted for multiplex selection. In practical application, if transition between T1 and E1 clock frequency is not needed, it's feasible to adopt just one frequency synthesizer and to attenuate jitter of the input signal to be de-jittered without using a multiplex selector.

Taking de-jittering process upon E1 clock signal for example, de-jittering performance of the present invention embodiment will be illustrated and analyzed hereinafter.

According to the present invention embodiment, according to the input reference clock with jitter, E1 digital frequency synthesizer changes frequency of the output clock relative to the input high frequency clock 128 MHz. There is a frequency change limitation, which is actually frequency offset of the system's input clock. In view of coding extension algorithm, the calculated result of frequency offset is:

$$\frac{\frac{1}{128\,M}}{\frac{2^{17}}{2^{12}} \times \frac{1}{2\,M}} = -2^{-11} = 488 \text{ ppm}$$

Therefore, in practical application, the present embodiment can set corresponding parameters based on requirements so as to meet the desirable frequency offset, like the frequency offset 500 ppm regulated in the international standard.

Basic structure of the present invention embodiment is a first-order digital phase-locked loop, so the bandwidth of the phase-locked loop is close to system's de-jittering bandwidth. Calculation formula of the de-jittering bandwidth $\omega_p$ is:

$$\omega_p = \frac{\frac{1}{128\,M}}{\frac{2^{17}}{\frac{2^9}{\pi}} \times \frac{1}{2\,M}} \times 2\,M = \frac{2^{-11}}{\pi} \times 2\,M = 41 \text{ Hz}$$

the frequency 41 Hz is divided by 64 with the result 0.64 Hz. Since the digital phase-locked loop is completely linearized in the above calculation, there is a certain error between the calculation result and practical measurement value. However, this calculating procedure can reflect each system parameter's effect upon the de-jittering bandwidth and can predict affect of the parameter change upon the result. De-jittering circuits with various desirable performances can finally be devised through such system structure. The most direct way to change the de-jittering bandwidth is to change the division coefficient of such frequency divider as shown in FIG. 6. While the division coefficient is changed, the bit number of the phase difference information outputted by the phase detector will certainly change accordingly. The phase detector devised in the embodiment of the present invention can completely adapt to such change through simple setting, like reserving certain bits for the sign bit of phase difference information outputted by the phase detector.

It can be seen from the above two embodiments that, the de-jittering method and apparatus for the clock signal is of low cost and high reliability due to simple principle, convenient implementation, clear structure and less area occupied in the integrated circuit. What's more, the method and apparatus thereof can implement transition between T1 and E1 clock signal so as to meet the practical requirements better.

The invention claimed is:

1. A de-jittering method for a clock signal employing a controllable divider, the method comprising:
    dividing a clock signal to be de-jittered and a feedback clock signal respectively;
    starting a count upon detection of a rising edge of the feedback divided clock signal;
    increasing a count value in response to detecting one period of an input high-frequency signal;
    decreasing the count value when detecting one period of the input high-frequency signal when detecting a falling edge of the divided clock signal to be de-jittered;
    terminating the counting procedure when detecting the rising edge of the next feedback divided clock signal;
    defining the count value as phase difference information;
    generating a control signal according to the phase difference information and outputting the control signal to the controllable divider; and
    the controllable divider dividing the input high-frequency signal to generate a stable clock signal according to the control signal, and outputting the stable clock signal as the feedback clock signal and the de-jittered clock signal.

2. The de-jittering method according to claim 1, wherein, the generated control signal is outputted to two or more controllable dividers;
    the de-jittering method further comprising: performing multiplex selection upon the feedback clock signal outputted by the two or more controllable dividers, wherein the selected clock signal is of the same frequency as that of the clock signal to be de-jittered and is taken as the feedback signal.

3. The de-jittering method according to claim 2, wherein, the clock signal to be de-jittered is T1 clock signal or E1 clock signal;
    the step of outputting the control signal to the controllable divider comprises:
    outputting the generated control signal to both T1 controllable divider and E1 controllable divider;
    the T1 controllable divider outputting the stable clock signal that has the same frequency as the T1 clock;
    the E1 controllable divider outputting the stable clock signal that has the same frequency as the E1 clock;
    selecting a clock signal from the multiple feedback clock signals outputted by T1 controllable divider and E1 controllable divider, wherein the selected clock signals are of the same frequency as that of the clock signal to be de-jittered and are taken as the practical feedback signal.

4. The de-jittering method according to claim 1, wherein the step of dividing process comprises:
    dividing the signals with a division coefficient $32 \times 2^n$ according to a required de-jittering performance;
    wherein frequency of the input high-frequency signal is $32 \times 2^n$ times higher than that of the clock signal to be de-jittered;
    where $n \geq 0$ and n being an integer.

5. The de-jittering method according to claim 1, wherein:
    the step of increasing a count value comprises:

increasing the count value by one;
the step of decreasing the count value comprises: decreasing the count value by one.

6. The de-jittering method according to claim 1, wherein the frequency of the high-frequency signal used for counting is $2^n$ times higher than that of the clock signal to be de-jittered, wherein the high-frequency signal is outputted by the controllable divider or is introduced from outside.

7. The de-jittering method according to claim 1, wherein the step of generating a control signal comprises: performing positive/negative overflow process upon the phase difference information to obtain the overflow signal and overflow direction information based on the phase difference;
the step of the controllable divider dividing the input high-frequency signal and outputting the stable clock signal as the feedback clock signal and the de-jittered clock signal, comprises:
the controllable divider dividing the input high-frequency signal according to the overflow signal and overflow direction information, and generating the stable clock signal that is outputted as the feedback clock signal and the de-jittered clock signal.

8. The de-jittering method according to claim 7, wherein the step for obtaining the overflow signal and overflow direction information based on the phase difference information comprises:
extending the coded sign of the phase difference information;
circularly accumulating the extension result;
performing positive/negative overflow process upon the accumulation result to obtain the overflow signal and overflow direction information based on the phase difference information.

9. The de-jittering method according to claim 8, wherein the step for extending the coded sign of the phase difference information comprises:
if the absolute value of the phase difference is less than or equal to 64, only extending the sign bits;
if the absolute value of the phase difference is higher than 64 and less than or equal to 128, extending the sign bits after calculating formula $|PT|+(|PT|-64)\times 2$ in terms of the phase difference,
if the absolute value of the phase difference is greater than 128 and less than or equal to 256, extending the sign bits after calculating formula $|PT|\times 2+(|PT|-128)\times 4$ in terms of the phase difference,
if the absolute value of the phase difference is greater than 256, extending the sign bits after calculating formula $|PT|\times 4+(|PT|-256)\times 8$ in terms of the phase difference, where PT denotes the phase difference.

10. The de-jittering method according to claim 7, wherein, the step for dividing the input high-frequency signal according to the overflow signal and overflow direction information comprises:
according to the overflow signal and overflow direction information, increasing or decreasing pulse period of the input high-frequency signal.

11. A de-jittering apparatus for a clock signal, comprising: a control-signal generating circuit and a controllable divider;
the control-signal generating circuit receiving the clock signal to be de-jittered and a feedback clock signal outputted by the controllable divider, comparing the clock signal to be de-jittered with the feedback clock signal and generating a control signal according to the comparison result, and outputting the control signal to the controllable divider;
the controllable divider receiving the control signal and a high-frequency signal from outside, dividing the high-frequency signal according to the control signal to generate a stable clock signal, which is outputted to the control-signal generating circuit as the feedback clock signal and is outputted as the de-jittered clock signal, wherein
the control-signal generating circuit comprises: a reference signal divider, a feedback clock signal divider, a phase detector and a coding accumulator;
the reference signal divider receives the clock signal to be de-jittered and outputs the signal to the phase detector after dividing it;
the feedback clock signal divider receives the feedback clock signal outputted by the controllable divider and outputs the signal to the phase detector after dividing it;
the phase detector starts a count upon detection of a rising edge of the feedback divided clock signal; increases a count value in response to detecting one period of an input high-frequency signal; decreases the count value when detecting one period of the input high-frequency signal when detecting a falling edge of the divided clock signal to be de-jittered; terminates the counting procedure when detecting the rising edge of the next feedback divided clock signal; and defines the count value as phase difference information, which is outputted to the coding accumulator;
the coding accumulator performs coding and accumulation upon the phase difference to generate the control signal with overflow signal and overflow direction information, which is outputted to the controllable divider.

12. The de-jittering apparatus according to claim 11, wherein, there are two or more than two controllable dividers and the apparatus further comprises: a multiplex selector;
the control signal generated by the control-signal generating circuit being sent to two or more controllable dividers;
the multiplex selector receiving the clock signal to be de-jittered and the feedback clock signal outputted by the two or more controllable dividers for multiplex selection, selecting the feedback clock signal that has the same frequency as the clock signal to be de-jittered, and outputting the selected signal to the control-signal generating circuit as the feedback signal.

13. The de-jittering apparatus according to claim 12, wherein, the controllable divider further outputs a high-frequency signal whose frequency is $2^n$ times higher than that of the clock signal to be de-jittered;
each high-frequency signal outputted by the controllable divider corresponds to one kind of clock signal to be de-jittered;
the multiplex selector receives the high-frequency signals outputted by two or more controllable dividers, selects the high-frequency signal that corresponds to the input clock signal to be de-jittered, and outputs the selected signal to the control-signal generating circuit;
the control-signal generating circuit compares the clock signal to be de-jittered with the feedback clock signal according to the received high-frequency signal.

14. The de-jittering apparatus according to claim 11, wherein, the coding accumulator comprises: a coded sign extension module, a circular accumulator and a positive/negative overflow processing module;
the coded sign extension module receives the phase difference information to extend coded sign bit of the phase difference, and transmits the processed result to the circular accumulator;

the circular accumulator performs circular accumulation upon the above processed result and transmits the accumulation result to positive/negative overflow processing module;

positive/negative overflow processing module performs the positive/negative overflow process upon the accumulation result to obtain the overflow signal and overflow direction information based on the phase difference information, latches the buffer and outputs the overflow signal and overflow direction information to the controllable divider.

15. The de-jittering apparatus according to claim 11, wherein, the controllable divider is a digital frequency synthesizer or other devices that can perform frequency division according to the control signal.

16. A de-jittering method for a clock signal, where a controllable divider is adopted, comprising:

dividing a clock signal to be de-jittered and a feedback clock signal respectively;

comparing the two divided signals to obtain phase difference information of the two signals;

extending a coded sign of the phase difference information comprising the steps of:
(a) if the absolute value of the phase difference is less than or equal to 64, extending sign bits,
(b) if the absolute value of the phase difference is higher than 64 and less than or equal to 128, extending the sign bits after calculating formula $|PT|+(|PT|-64)\times 2$ in terms of the phase difference,
(c) if the absolute value of the phase difference is greater than 128 and less than or equal to 256, extending the sign bits after calculating formula $|PT|\times 2+(|PT|-128)\times 4$ in terms of the phase difference, and
(d) if the absolute value of the phase difference is greater than 256, extending the sign bits after calculating formula $|PT|\times 4+(|PT|-256)\times 8$ in terms of the phase difference, where PT denotes the phase difference;

circularly accumulating the extension result;

performing positive/negative overflow process upon the accumulation result to obtain the overflow signal and overflow direction information based on the phase difference information;

outputting the overflow signal and overflow direction information to the controllable divider;

the controllable divider dividing an input high-frequency signal according to the overflow signal and overflow direction information; and generating a stable clock signal that is outputted as the feedback clock signal and the de-jittered clock signal.

17. The de-jittering method according to claim 16, wherein, the step for dividing the input high-frequency signal according to the overflow signal and overflow direction information comprises:

increasing or decreasing pulse period of the input high-frequency signal according to the overflow signal and overflow direction information.

* * * * *